(12) United States Patent
Sun et al.

(10) Patent No.: US 8,552,803 B2
(45) Date of Patent: Oct. 8, 2013

(54) AMPLIFIER WITH DYNAMIC BIAS

(75) Inventors: Bo Sun, Carlsbad, CA (US); Sankaran Aniruddhan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 523 days.

(21) Appl. No.: 11/959,209

(22) Filed: Dec. 18, 2007

(65) Prior Publication Data

US 2009/0153248 A1      Jun. 18, 2009

(51) Int. Cl.
*H03F 1/30*     (2006.01)
(52) U.S. Cl.
USPC ........................................... 330/290; 330/279
(58) Field of Classification Search
USPC .................. 330/290, 279, 285, 296, 278, 311
See application file for complete search history.

(56) References Cited

U.S. PATENT DOCUMENTS

| | | | | |
|---|---|---|---|---|
| 3,378,781 A | * | 4/1968 | Hill | 330/290 |
| 5,345,191 A | * | 9/1994 | Tanaka | 330/277 |
| 5,589,796 A | * | 12/1996 | Alberth et al. | 330/133 |
| 5,914,641 A | | 6/1999 | Yun et al. | |
| 6,047,167 A | * | 4/2000 | Yamashita | 455/126 |
| 6,803,803 B1 | | 10/2004 | Starr et al. | |
| 6,977,550 B2 | * | 12/2005 | Ishida et al. | 330/279 |
| 7,358,810 B2 | | 4/2008 | Kwon et al. | |
| 7,443,242 B2 | * | 10/2008 | Ishida | 330/279 |

FOREIGN PATENT DOCUMENTS

| | | |
|---|---|---|
| CN | 1402432 A | 3/2003 |
| CN | 1527583 A | 9/2004 |
| EP | 1115211 A1 | 7/2001 |
| JP | 5235646 A | 9/1993 |
| JP | 2001036351 A | 2/2001 |
| JP | 2001203541 A | 7/2001 |
| JP | 2003347864 A | 12/2003 |
| JP | 2004289492 A | 10/2004 |
| JP | 2005151411 A | 6/2005 |
| JP | 2006054256 A | 2/2006 |
| WO | 9914854 | 3/1999 |

OTHER PUBLICATIONS

International Search Report—PCT/US08/086856—ISA/EPO—Jun. 22, 2009.
Seo et al., "High-Voltage-Tolerant Analog Circuits Design In Deep-Submicrometer CMOS Technolgies", IEEE Transactions On Circuits And Systems I: Regular Papers, IEEE, US, vol. 54, No. 10, Oct. 1, 2007, pp. 2159-2166.
Taiwan Search Report—TW097149485—TIPO—Jan. 3, 2012.
Written Opinion—PCT/US08/08/685613 International Search Authority European Patent Office—Jun. 22, 2009.

\* cited by examiner

*Primary Examiner* — Henry Choe
(74) *Attorney, Agent, or Firm* — S. Hossain Beladi

(57) ABSTRACT

Techniques are provided for dynamically biasing an amplifier to extend the amplifier's operating range while conserving power. In an embodiment, a detector is provided to measure the amplifier output to determine an operating region of the amplifier. The output of the detector may be input to a bias adjuster, which outputs a dynamic voltage level supplied to at least one bias transistor in the amplifier. Multiple embodiments of the detector and bias adjuster are disclosed.

22 Claims, 15 Drawing Sheets

AMPLIFIER WITH DYNAMIC BIAS

TECHNICAL FIELD

The disclosure relates to integrated circuits (IC's), and more specifically, to IC amplifier design.

BACKGROUND

An amplifier is designed to provide constant gain to an input signal to generate an amplified output signal. An amplifier is usually able to provide constant gain only over a limited operating range of input and output signals. If the magnitude of the input or output signal falls outside the operating range, the amplifier may exhibit gain compression and/or other non-linear characteristics.

One way to extend the operating range of the amplifier is to increase the gain when the signal falls outside the operating range. In transistor amplifier designs, the gain provided to a signal is often related to the amount of current used to bias the transistor or transistors in a gain stage of the amplifier. Typically, greater current consumption increases gain, while lower current consumption saves power.

It would be desirable to dynamically adjust the biasing of the transistors in the amplifier to extend the operating range of the amplifier when necessary, while conserving power during normal operation.

SUMMARY

An aspect of the present disclosure provides an amplifier for amplifying an input signal to generate an output signal, the amplifier comprising a first bias transistor having a first bias level, the gain of the amplifier being a function of the first bias level, the amplifier further comprising: a first detector for measuring a first envelope of the output signal; and a first bias adjuster for shifting the voltage level of the output voltage of the first detector, the output of the first bias adjuster adjusting the first bias level.

Another aspect of the present disclosure provides a method for amplifying an input signal to generate an output signal, the amplifying comprising coupling an input signal to an amplifier to generate an output signal, the amplifier comprising a first bias transistor having a first bias level, the gain of the amplifier being a function of the first bias level, the method comprising: measuring a first envelope of the output signal with a first detector; shifting the voltage level of the measured envelope of the output signal with a first bias adjuster; and adjusting the first bias level with said shifted voltage level.

Yet another aspect of the present disclosure provides an amplifier for amplifying an input signal to generate an output signal, the amplifier comprising a first NMOS transistor for providing gain to the input signal; a first PMOS transistor for providing gain to the input signal, the output of the first NMOS transistor coupled to the output of the first PMOS transistor; a first bias transistor having a first bias level, the first bias transistor supplying a current for the first NMOS transistor and the first PMOS transistor; first mirror circuitry coupled to the first bias level, the current through the first mirror circuitry being a fixed proportion of the current through the first bias transistor; and an auxiliary bias transistor coupled to the first mirror circuitry, the current through the first mirror circuitry further being said fixed proportion of the current through the first auxiliary bias transistor, the auxiliary bias transistor further coupled to either the first NMOS transistor or the first PMOS transistor.

Yet another aspect of the present disclosure provides an amplifier for amplifying an input signal to generate an output signal, the amplifier comprising a first bias transistor having a first bias level, the gain of the amplifier being a function of the first bias level, the amplifier further comprising: means for measuring a first envelope of the output signal; and means for shifting the voltage level of the output voltage of the first detector, the output of the first bias adjuster adjusting the first bias level.

DETAILED DESCRIPTION

Disclosed herein are techniques for dynamically biasing an amplifier to extend the amplifier's operating range while conserving power during normal operation.

Figure 1:
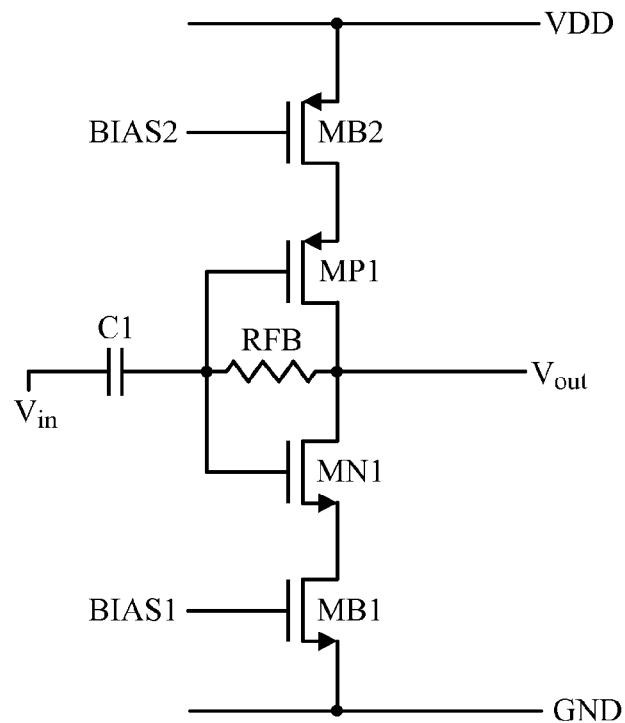
FIG. 1 depicts a prior art amplifier.

FIG. 1 depicts a prior art amplifier. In FIG. 1, an input voltage Vin is coupled via AC coupling capacitor C1 to the gates of transistors MN1 and MP1, which are configured as common source amplifiers sharing an output Vout. The sources of MN1 and MP1 are coupled to the drains of transistors MB1 and MB2, respectively. MB1 and MB2 have constant bias voltages Bias1 and Bias2, and can be viewed as providing source degeneration for the transistors MN1 and MP1. Resistor RFB couples the amplifier output to the input, and sets the bias point for MN1 and MP1 close to the middle of the supply voltage VDD.

Figure 2:
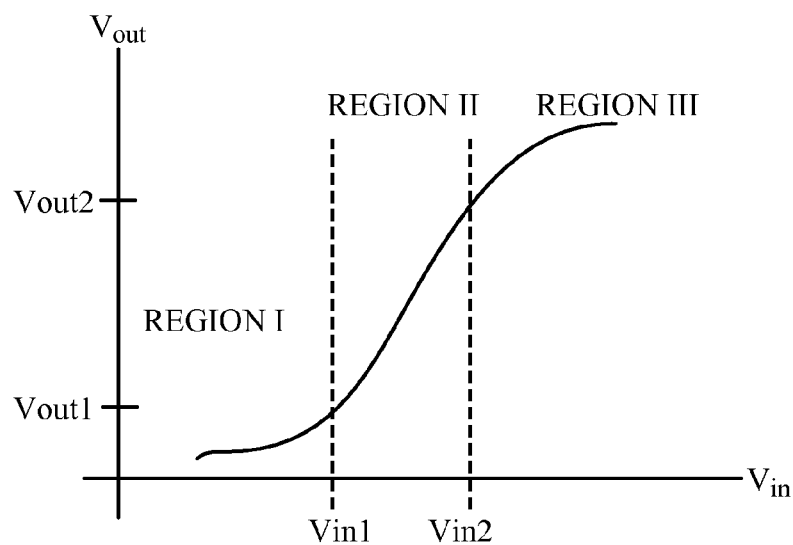
FIG. 2 depicts a representative transfer characteristic Vout vs. Vin for the amplifier of FIG. 1.

FIG. 2 depicts a representative transfer characteristic Vout vs. Vin for the amplifier of FIG. 1. As shown in FIG. 2, the amplifier has high, constant gain and exhibits good linearity for levels of Vin in the range marked Region II. In contrast, the amplifier has low, variable gain and exhibits nonlinear behavior for levels of Vin in the ranges marked Region I and Region III. In amplifier applications, this may restrict the useful operating input range of the circuit to Region II, corresponding to levels of Vin between Vin1 and Vin2 and levels of Vout between Vout1 and Vout2.

According to the present disclosure, techniques are provided to dynamically adjust the useful operating range of the amplifier depending on a measured characteristic of the input and/or output voltages.

Figure 3:
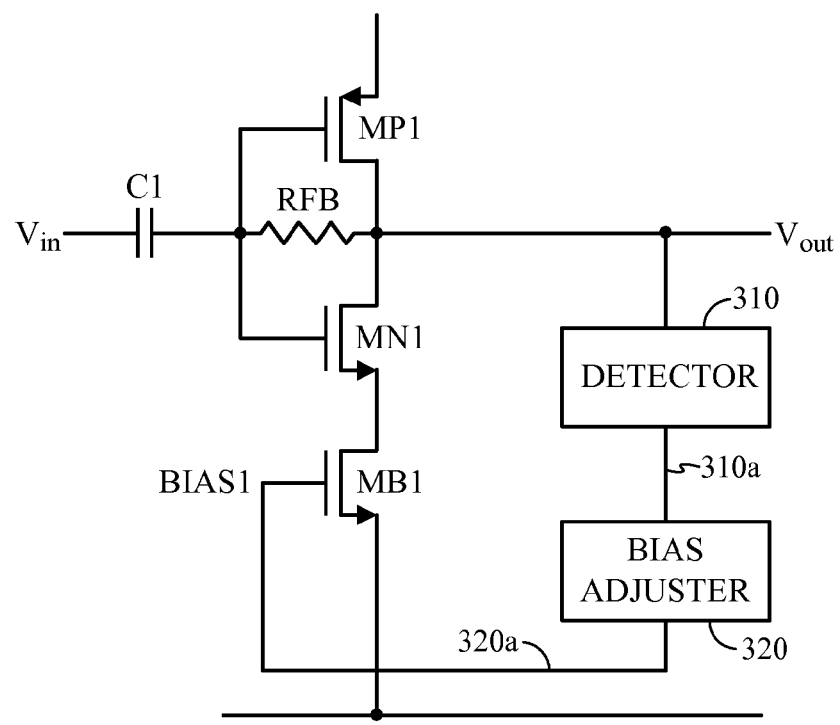
FIG. 3 depicts an embodiment wherein the voltage Bias1 is made dynamically adjustable depending on the measured envelope of the output voltage.

FIG. 3 depicts an embodiment wherein the voltage Bias1 is made dynamically adjustable depending on the measured envelope of the output voltage. In FIG. 3, a detector 310 is coupled to the output voltage Vout. The detector 310 functions to provide an output signal 310a that may indicate the operation region of the amplifier, and/or fluctuations in the low-frequency envelope of the output voltage. The signal 310a is coupled to a bias adjuster 320, which generates a voltage 320a applied to the gate of transistor MB1 based on the signal 310a. The bias voltage Bias1 may be dynamically adjusted based on the amplifier output's measured envelope.

In an embodiment, when Vout is detected to be within Regions I or II, i.e., less than Vout2 according to FIG. 2, then the bias voltage Bias1 is fixed at a constant level. When Vout is detected to be within Region III, i.e., greater than or equal to Vout2 according to FIG. 2, then the bias voltage Bias1 is allowed to vary depending on the measured level of the envelope of Vout. An increase in Bias1 causes a decrease in MB1's resistive source degeneration and an increase in the current flowing through the amplifier, hence increasing the amplifier gain. The mechanism thus partially compensates for the decrease in gain experienced when the amplifier is operating in Region III.

Figure 4:
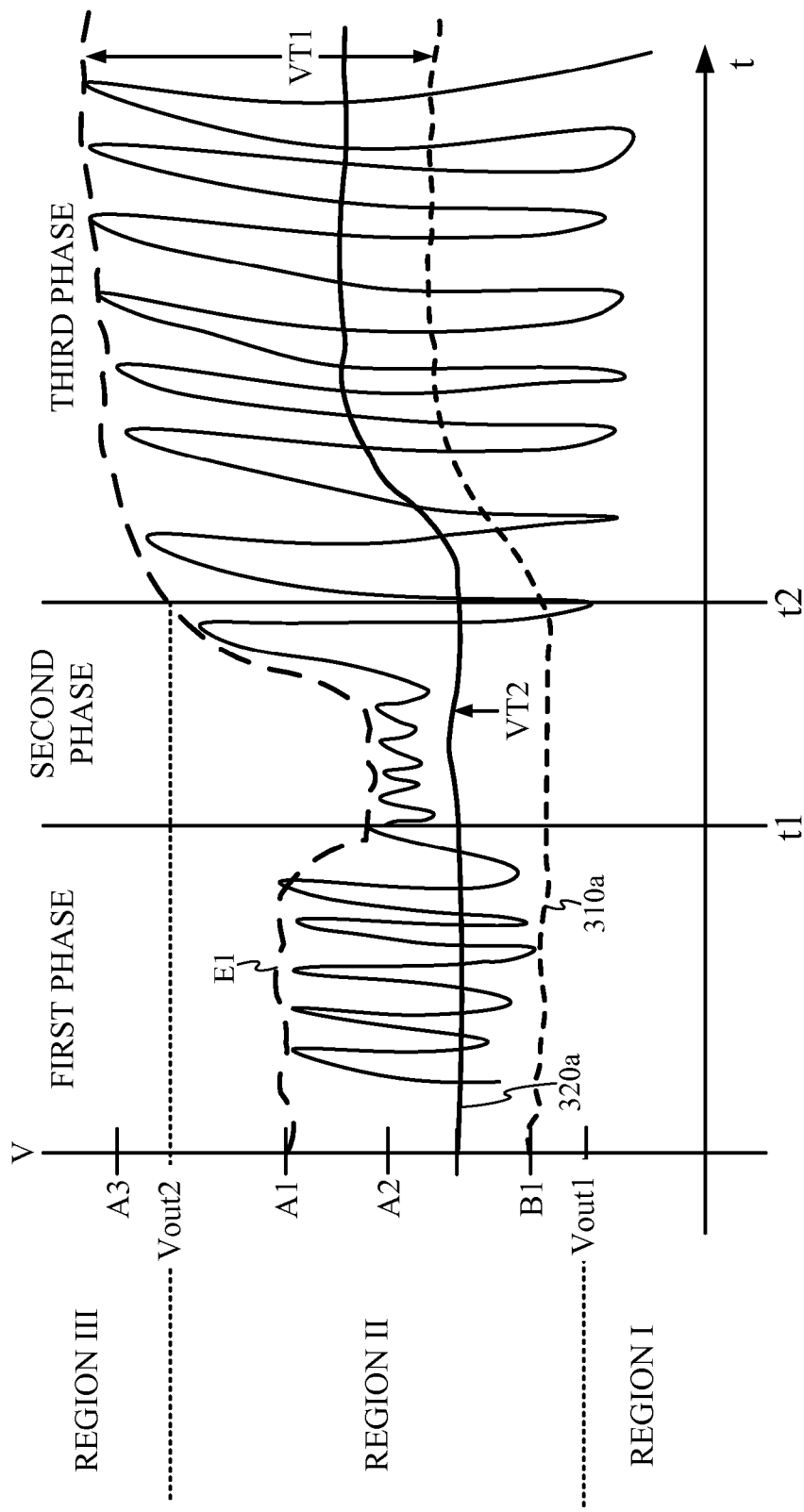
FIG. 4 depicts an embodiment of the signal levels present in the circuitry of FIG. 3.

FIG. 4 depicts the signal levels present in the circuitry of FIG. 3. In FIG. 4, E1 represents the envelope corresponding to the upper peaks of signal Vout. During a first phase, E1 falls in Region II with a value of A1, and signal 310a has a value B1. During a second phase, E1 still falls in Region II with a value of A2, and signal 310a is fixed at B1. During a third phase, E1 falls in Region III with a value of A3. In response to E1 increasing beyond the level of Vout2, indicating a transition from Region II to Region III, signal 310a begins to follow E1. A fixed offset VT1 may be present between E1 and 310a in the third phase.

In FIG. 4, the bias adjuster 320 of FIG. 3 level shifts 310a by a value VT2 to produce the signal 320a. 320a may then be directly coupled to the gate of bias transistor MB1.

Note in an embodiment (not shown), the signal 310a may be directly coupled to the gate of bias transistor MB1, without a bias adjuster 320a.

Figure 5:
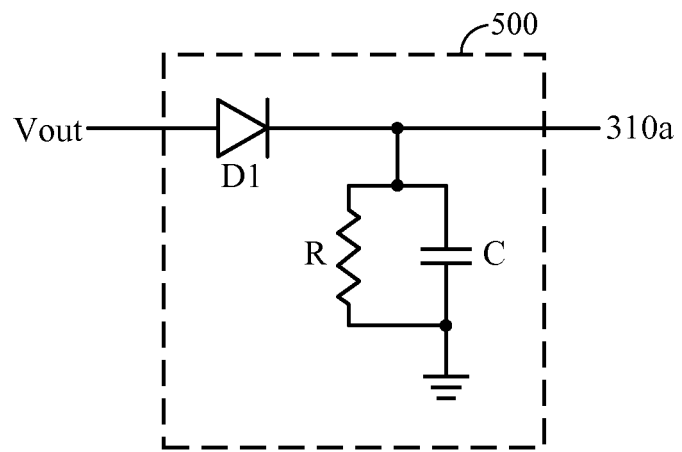
FIG. 5 depicts an embodiment 500 of the detector 310 in FIG. 3.

FIG. 5 depicts an embodiment 500 of the detector 310 in FIG. 3. In FIG. 5, a diode D1 is coupled to a low pass RC filter to form a simple peak/envelope diode detector. Diode D1 has a fixed turn-on voltage VD1, which represents the voltage drop needed to forward bias the diode. In an embodiment, VD1 can be designed to approximately match the level of Vout2 shown in FIG. 2. In this case, the output voltage measured at the output of the diode D1 will have the characteristics of the signal 310a described with reference to FIG. 4, with VT1 equal to VD1, and B1 equal to zero. One of ordinary skill in the art will realize that the magnitude of VD1 depends on characteristics of the transistor MD1 such as the dimensions of the transistor as well as its turn-on voltage. One of ordinary skill in the art will also realize that the value of VD1 may be chosen by the designer according to the requirements of any particular application.

Note in an embodiment, the cutoff frequency of the RC low-pass filter is chosen to be preferably greater than the bandwidth of Vout's expected envelope variation, but less than the carrier frequency of Vout.

Figure 5A:
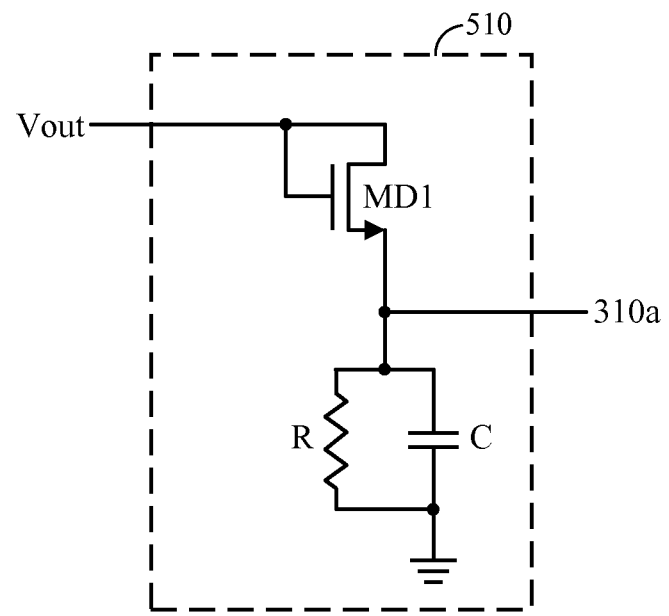

FIG. 5A depicts an alternative embodiment 510 of the envelope detector 310 in FIG. 3, wherein the diode in the detector is implemented as a standard diode-connected NMOS transistor MD1.

Figure 6:
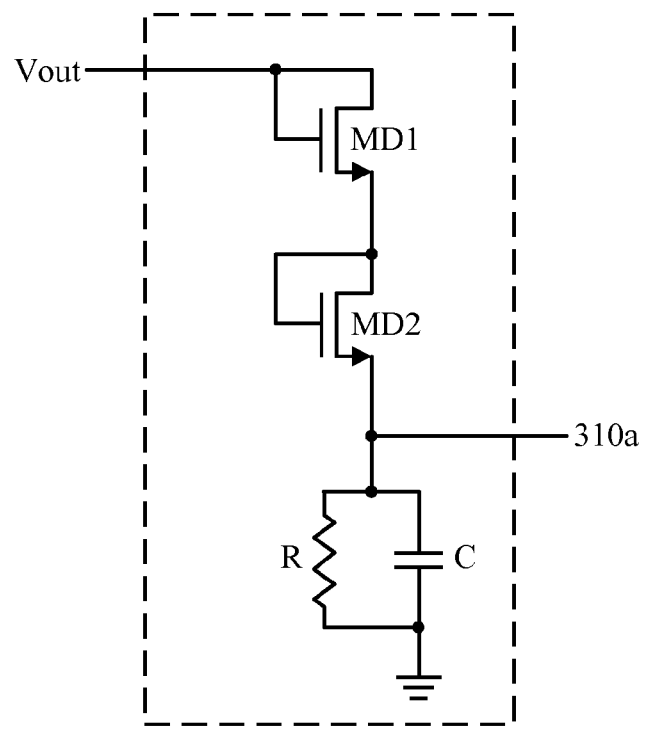
FIG. 6 depicts two diodes coupled in series to increase the attainable levels of VD1.
Figure 7:
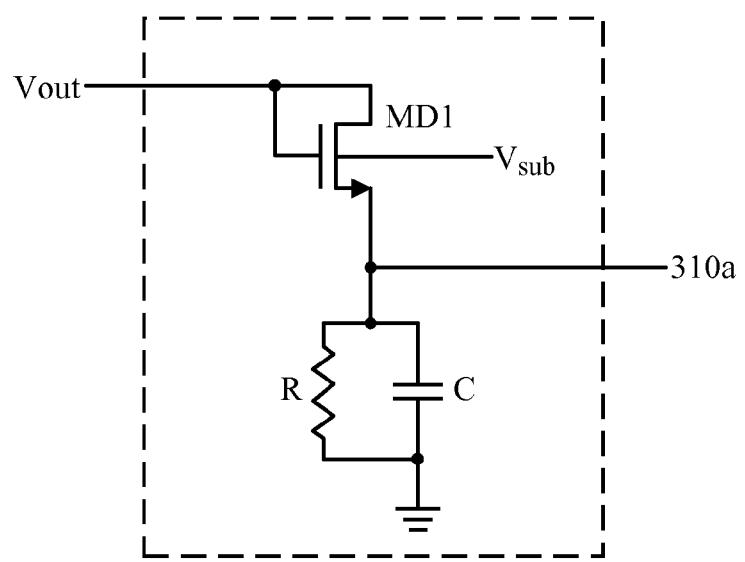
FIG. 7 depicts an embodiment of an envelope detector wherein the substrate bias of transistor MD1 is set to a voltage Vsub, wherein Vsub may be greater than the source voltage of transistor MD1.

FIGS. 6 and 7 depict alternative embodiments of detectors allowing for greater flexibility in setting the turn-on threshold of the envelope detector to correspond to the desired value Vout2. In FIG. 6, two diodes are coupled in series to increase the attainable levels of VT1. The effective level of VT1 is then the sum of the turn-on voltages of MD1 and MD2. One of ordinary skill in the art will realize that any number of diodes may be connected in series to achieve an appropriate level of VT1.

FIG. 7 depicts an embodiment of an envelope detector wherein the substrate bias of transistor MD1 is set to a voltage Vsub, wherein Vsub may be greater than the source voltage of transistor MD1. This has the effect of reducing the threshold voltage of MD1, which reduces the turn-on voltage VD1. In this way, configuring Vsub provides further flexibility in choosing VT1.

One of ordinary skill in the art will realize that the techniques described in FIGS. 6 and 7 may be combined, e.g., multiple diode-connected transistors may be provided in series, and one or more of the transistors may have the substrate bias set higher than the source voltage.

One of ordinary skill in the art will realize that by adjusting the size of MB1 and MB2, and/or adjusting the size of diode transistors MD1, and/or stacking diodes in series, and/or adjusting the threshold voltage of any of these transistors using the substrate bias, the value of VT1 may be chosen according to the requirements of the particular application.

Figure 8A:
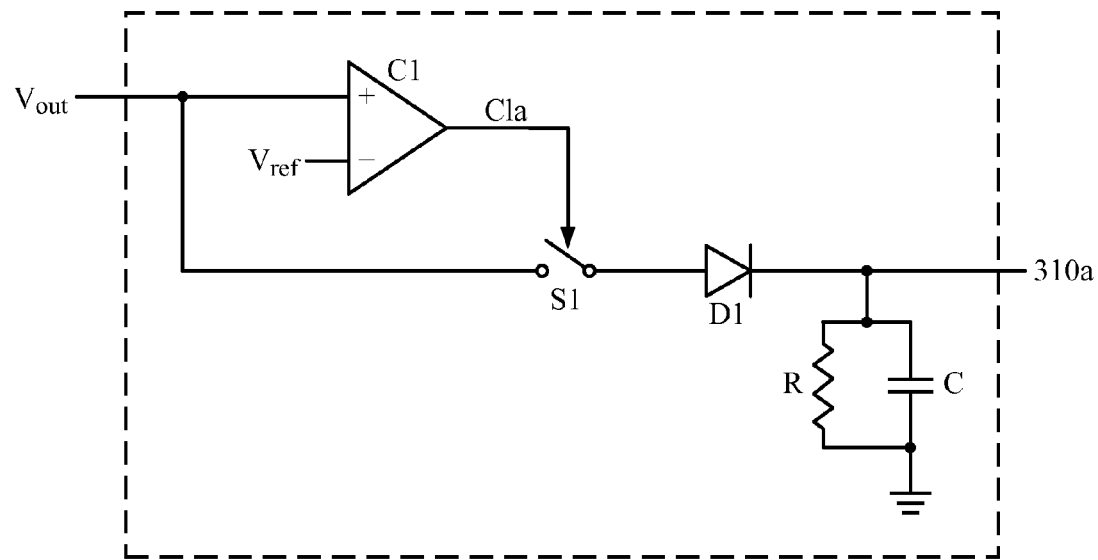
FIGS. 8A and 8B depict alternative embodiments of detector 310.

FIG. 8A depicts an alternative embodiment of a detector 310. In FIG. 8A, Vout is compared to a reference level Vref by comparator C1. The output C1a of the comparator controls a switch S1. In an embodiment, if Vout is higher than Vref, then S1 is closed, otherwise, S1 is open. If closed, switch S1 couples Vout to a simple diode detector comprising diode D1 and an RC filter.

In an embodiment, the value of Vref feeding comparator C1 may be set to Vout2 minus VD1, where Vout2 is the transition voltage level depicted in FIG. 2. In an alternative embodiment, Vref may be made programmable depending on, for example, parameters determined from a calibration step.

Figure 8B:
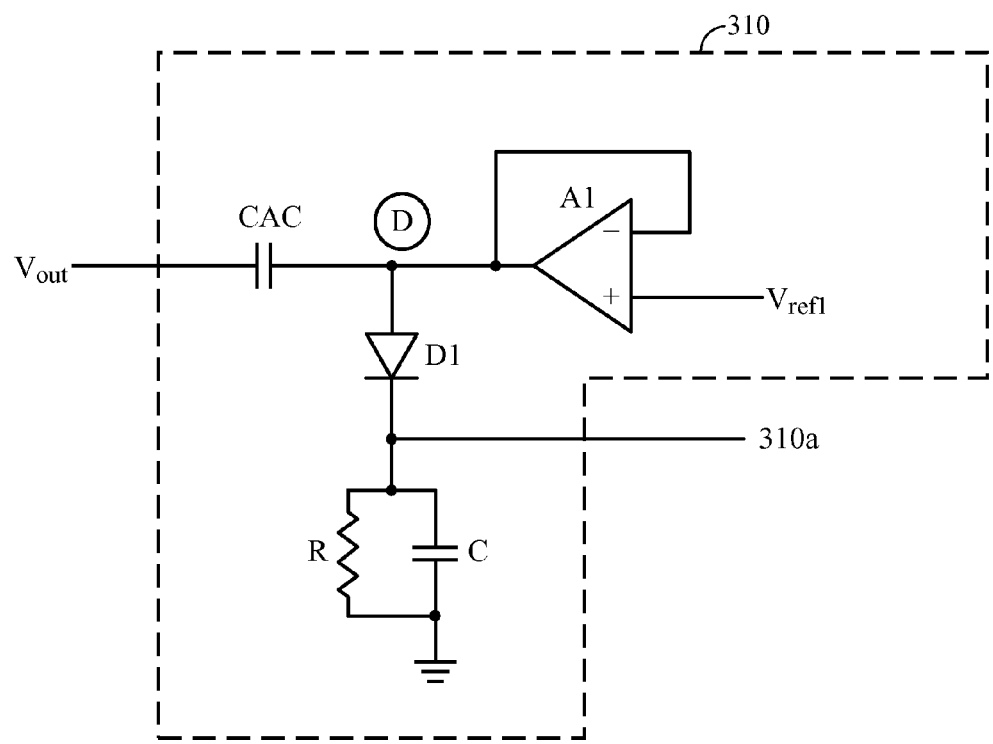

FIG. 8B shows an alternative embodiment of a detector 310. In FIG. 8B, the node D is AC coupled to the output voltage Vout via capacitor CAC. Node D is also coupled to the input of a diode detector comprising a diode D1 and an RC filter. The DC voltage at node D is set to Vref1 by unity-gain buffer A1. Note the unity-gain buffer A1 may be configured to have a high output impedance, so that there is minimal loading of the AC signal at node D by the output of A1. The level of Vref1 can be chosen such that the diode D1 in the diode detector starts conducting whenever the peak AC component of the voltage Vout exceeds a predetermined threshold.

For example, the predetermined threshold may be chosen as Vout2 minus VDD/2, where VDD/2 approximates the DC bias of the voltage Vout. Then Vref1 may be set to VD1 minus Vout2 plus VDD/2, where VD1 is the turn-on voltage of the diode. In this case, the diode D1 will start conducting when the AC component of Vout exceeds Vout2 minus VDD/2.

One of ordinary skill in the art may employ alternative techniques not shown to design a detector with the functionality described herein. Such embodiments are contemplated to be within the scope of the present disclosure.

Figure 9A:
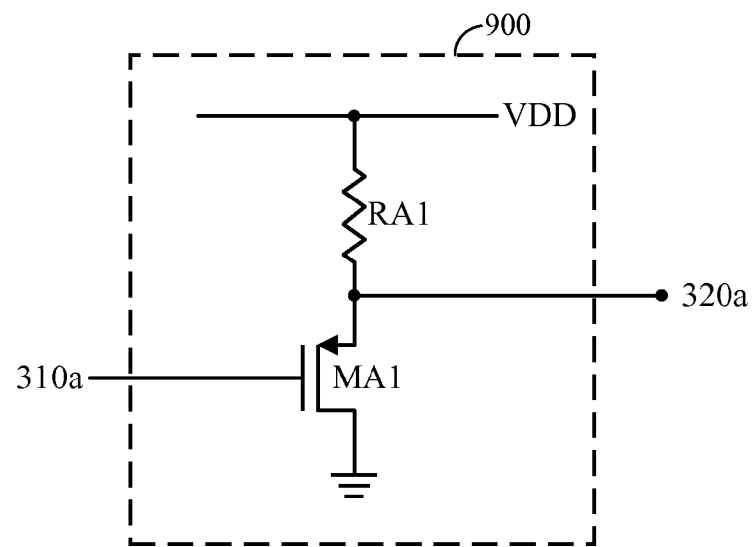
FIGS. 9A and 9B show embodiments of the bias adjuster 320.

FIG. 9A shows an embodiment of the bias adjuster 320 from FIG. 3. In FIG. 9A, bias adjuster 320 is implemented as a PMOS source follower 900. In FIG. 9A, block 900 includes a PMOS transistor MA1 with a resistor RA1 coupled to its source. The source follower 900 provides a fixed positive voltage shift VA1 to the voltage 310*a* to generate voltage 320*a*. One of ordinary skill in the art will realize that the magnitude of VA1 depends on characteristics of the transistor MA1, such as dimensions of MA1 and its threshold voltage. The value of VA1 may be selected to correspond to the value of VT2 depicted in FIG. 2.

Figure 9B:
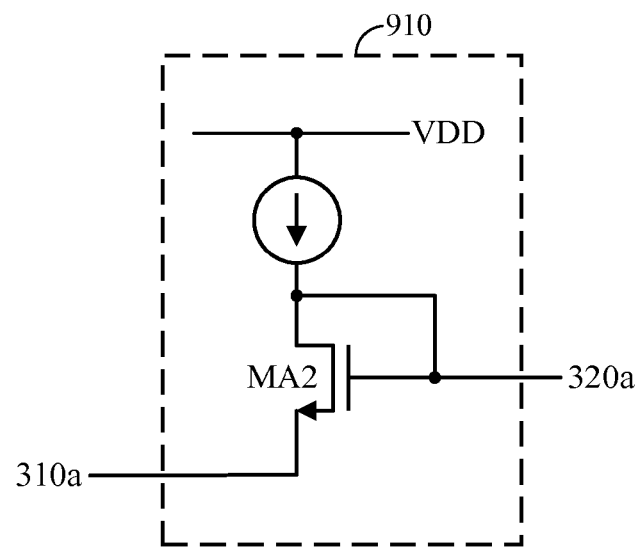

FIG. 9B shows an alternative embodiment of the bias adjuster 320, wherein the voltage 310*a* is supplied to the source of a diode-connected NMOS device MA2.

In alternative embodiments (not shown), the bias adjuster 320 may comprise any circuitry that shifts the signal 310*a* by a specific voltage. In an embodiment, the specific voltage may be made programmable depending on, for example, parameters determined from a calibration step.

Note one of ordinary skill in the art will realize that all of the techniques described herein to bias the NMOS transistor MB1 may be applied to bias the PMOS transistor MB2, with the appropriate adjustments made to the polarity of the signals and the devices disclosed. Such embodiments are contemplated to be within the scope of the present disclosure.

Figure 10:
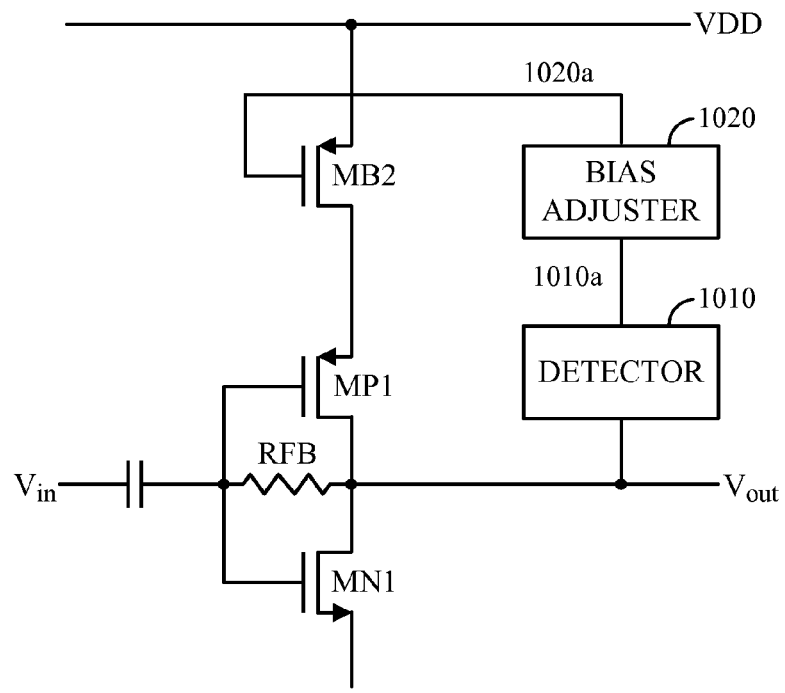
FIG. 10 depicts an embodiment wherein an MB2 envelope detector 1010 and an MB2 bias adjuster 1020 are provided to adjust the PMOS bias transistor MB2 of the amplifier shown in FIG. 1.

For example, FIG. 10 depicts an embodiment wherein a detector 1010 and a bias adjuster 1020 are provided to adjust the PMOS bias transistor MB2 of the amplifier shown in FIG. 1.

Figure 10B:
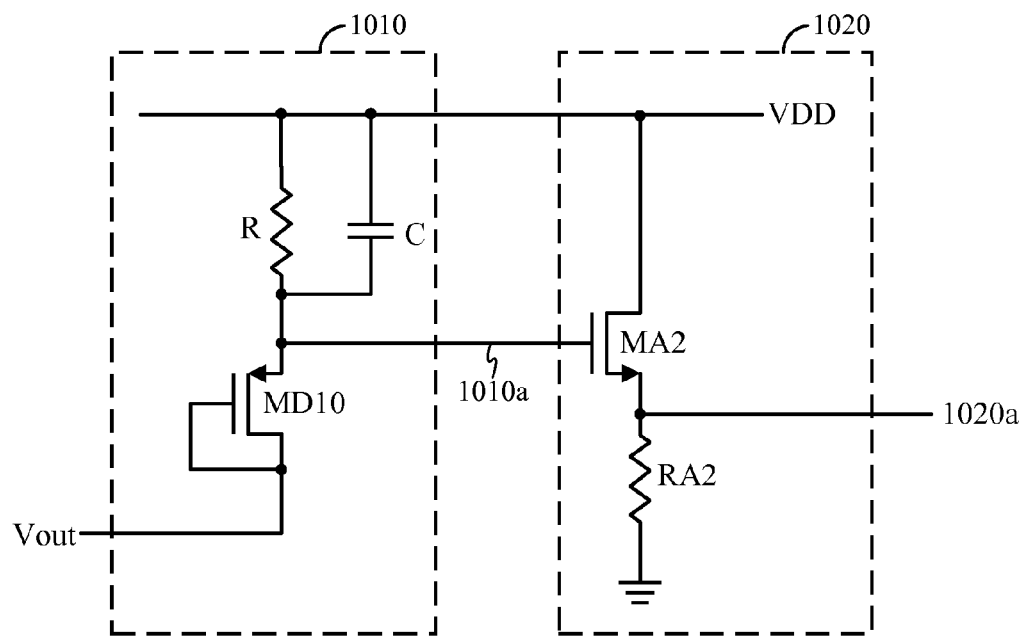
Figure 10A:
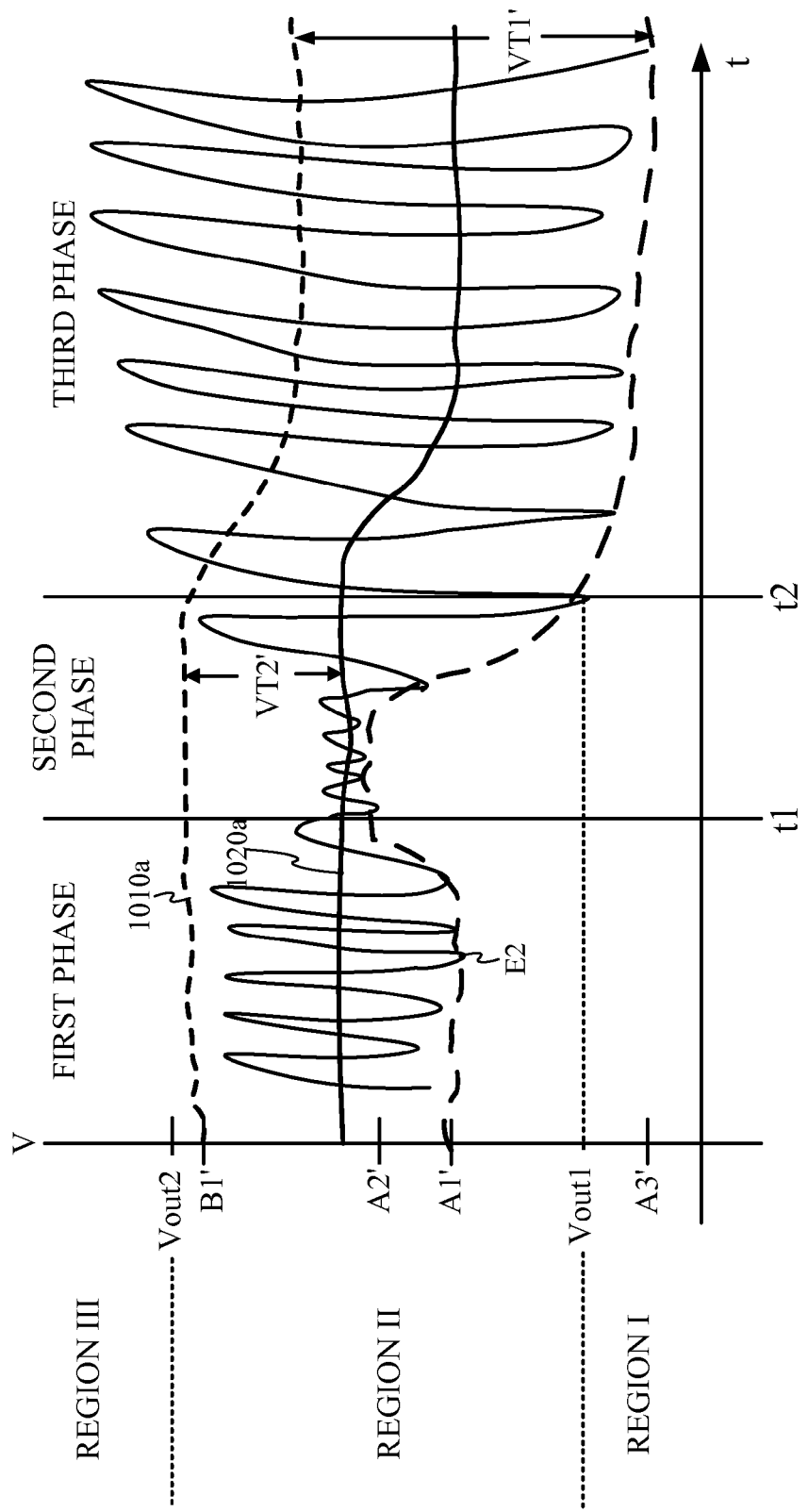

In particular, FIG. 10A depicts the signal levels present in the circuitry of FIG. 10. In FIG. 10A, E2 represents the envelope corresponding to the lower peaks of signal Vout. During a first phase, E2 falls in Region II with a value of A1', and signal 1010*a* has a value B1'. During a second phase, E2 still falls in Region II with a value of A2', and signal 1010*a* is fixed at B1'. During a third phase, E2 falls in Region I with a value of A3'. In response to E2 decreasing beyond the level of Vout1, indicating a transition from Region II to Region I, signal 1010*a* begins to follow E2. A fixed offset VT1' may be present between E2 and 1010*a* in the third phase.

In FIG. 10, the bias adjuster 1020 level shifts 1010*a* by a value VT2' to produce the signal 1020*a* in FIG. 10A. 1020*a* may then be directly coupled to the gate of bias transistor MB2.

An embodiment of a PMOS envelope detector 1010 and an NMOS bias adjuster 1020 is shown in FIG. 10B.

In an embodiment (not shown), the input to the detector may be directly coupled to the gates of transistors MN1 and MP1, rather than to the drains of MN1 and MP1. The detector and adjuster may also be directly coupled to the input voltage Vin. Such embodiments are contemplated to be within the scope of the present disclosure.

Figure 11:
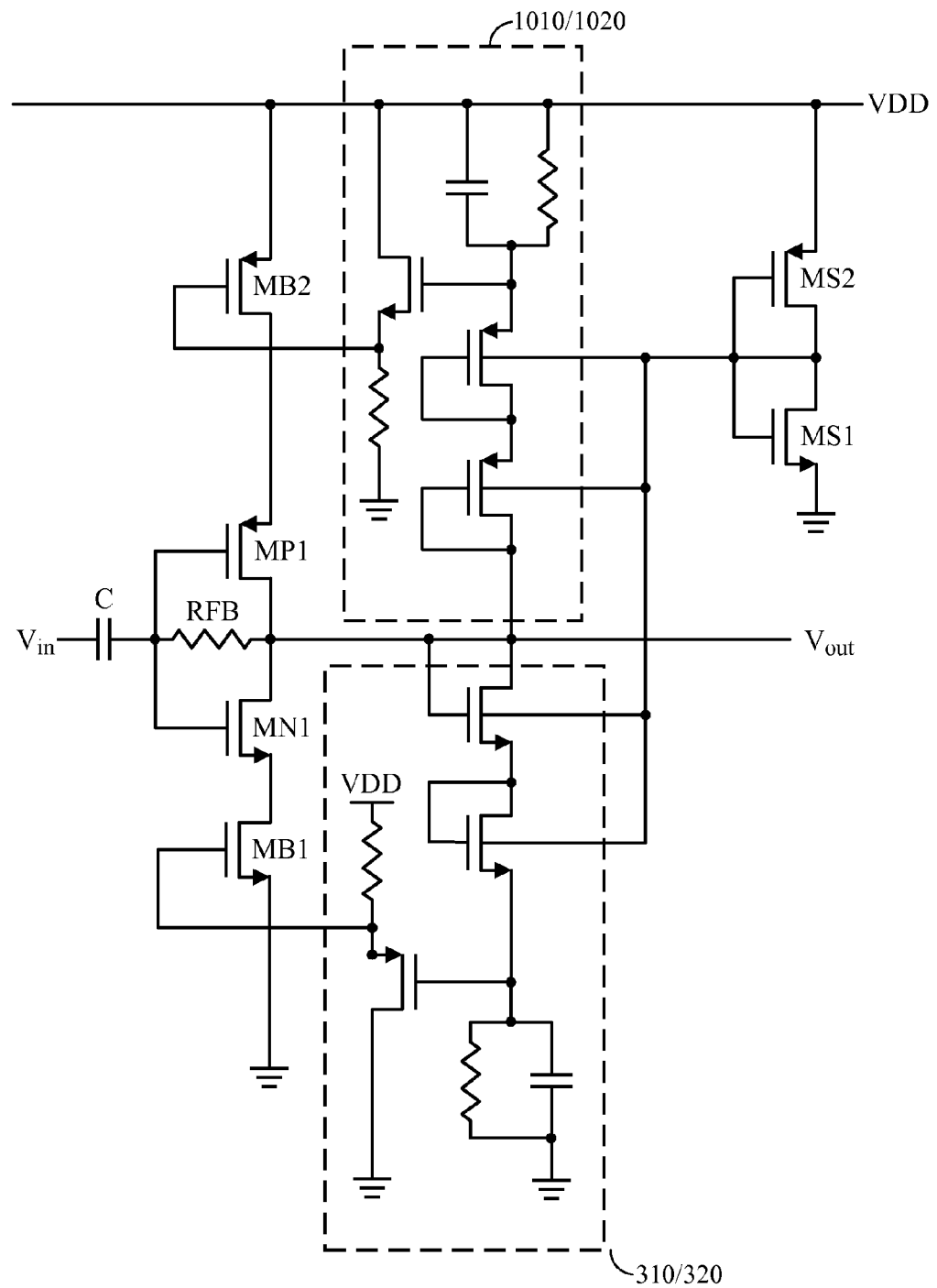
FIG. 11 depicts an embodiment combining several of the techniques disclosed herein for dynamically adjusting the bias voltages of an amplifier.

FIG. 11 depicts an embodiment combining several of the techniques disclosed herein for dynamically adjusting the bias voltages of an amplifier. Blocks labeled 310/320 refer to the detector and bias adjuster depicted in FIG. 3, while blocks labeled 1010/1020 refer to the same blocks depicted in FIG. 10. In FIG. 11, transistors MS1 and MS2 are configured as an inverter with the output coupled to the input so that the output voltage level is close to the middle range of the voltage supply. The output voltage is used to bias the substrates of the transistors in the detector 3 10. This may be done in accordance with the principles described herein with reference to FIG. 7. In light of the disclosures herein, one of ordinary skill in the art will readily comprehend the operation of the circuitry depicted in FIG. 11.

Figure 12:
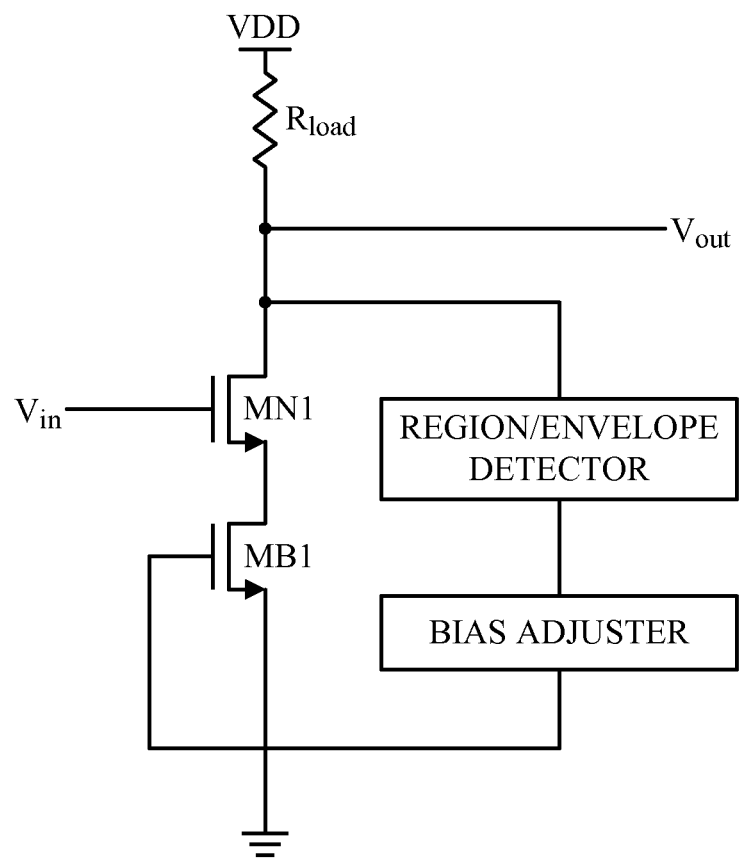
FIG. 12 depicts a common source amplifier having a single active transistor, the amplifier employing a detector and a bias adjuster.

Note while the detector and bias adjuster have been described herein with reference to the amplifier topology of FIG. 1, one of ordinary skill in the art will realize that the techniques may be applied to any amplifier topology comprising bias transistors, wherein adjusting the bias voltage of the transistors increases the gain of the amplifier. For example, a common source amplifier having a single active transistor may employ a detector and a bias adjuster, as depicted in FIG. 12. Such embodiments are contemplated to be within the scope of the present disclosure.

Figure 13:
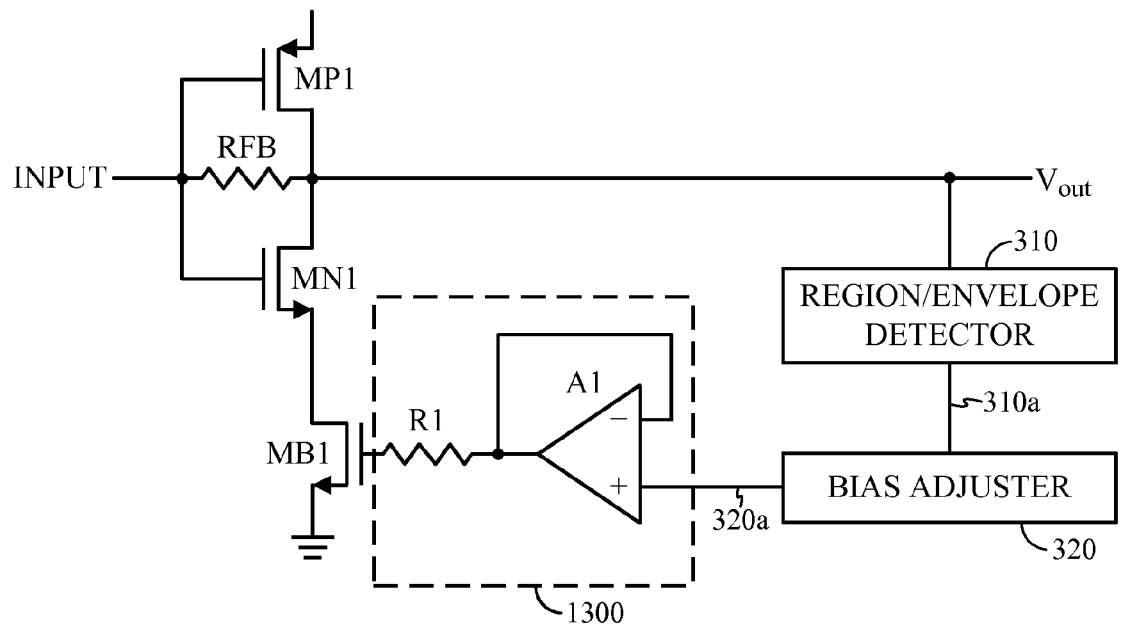
FIG. 13 depicts an embodiment wherein a buffer 1300 is provided between the bias adjuster 320 and the gate of transistor MB1.

FIG. 13 depicts an embodiment wherein a buffer 1300 is provided between the bias adjuster 320 and the gate of transistor MB1. In FIG. 13, an amplifier A1 is configured as a unity-gain buffer coupled to the gate of transistor MB1 via resistor R1. Note R1 may be chosen to provide low-pass filtering of the signal 320*a*, in conjunction with the gate capacitance of MB1.

One of ordinary skill in the art may derive other embodiments for implementing the functionality of buffer 1300. Such embodiments are contemplated to be within the scope of the present disclosure.

Figure 14:
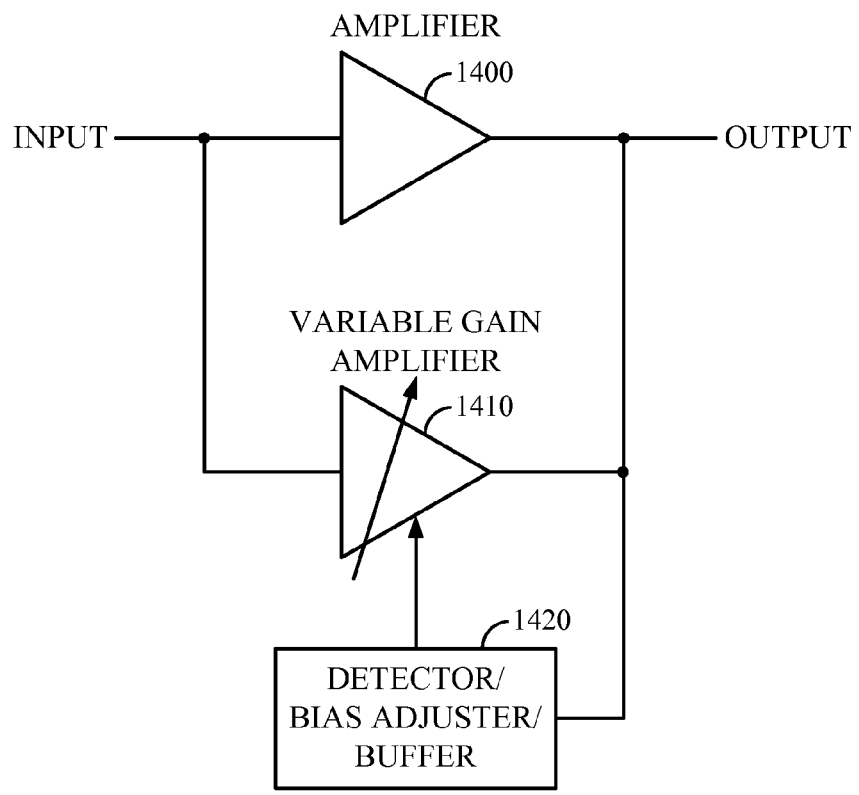
FIG. 14 depicts an embodiment wherein an amplifier 1400 having non-adjustable gain is combined with a variable gain amplifier 1410 designed according to the principles of the present disclosure.

FIG. 14 depicts an embodiment wherein an amplifier 1400 having non-adjustable gain is combined with a variable gain amplifier 1410 designed according to the principles of the present disclosure. In this embodiment, the variable gain amplifier 1410 may be provided with a detector for detecting a region of operation of the amplifier 1400. When the amplifier 1500 is detected to be operating in Regions I or III, the gain of the variable gain amplifier 1410 may be increased. Thus the variable gain amplifier 1410 may provide a gain boost to the amplifier 1400 when needed.

Figure 15:
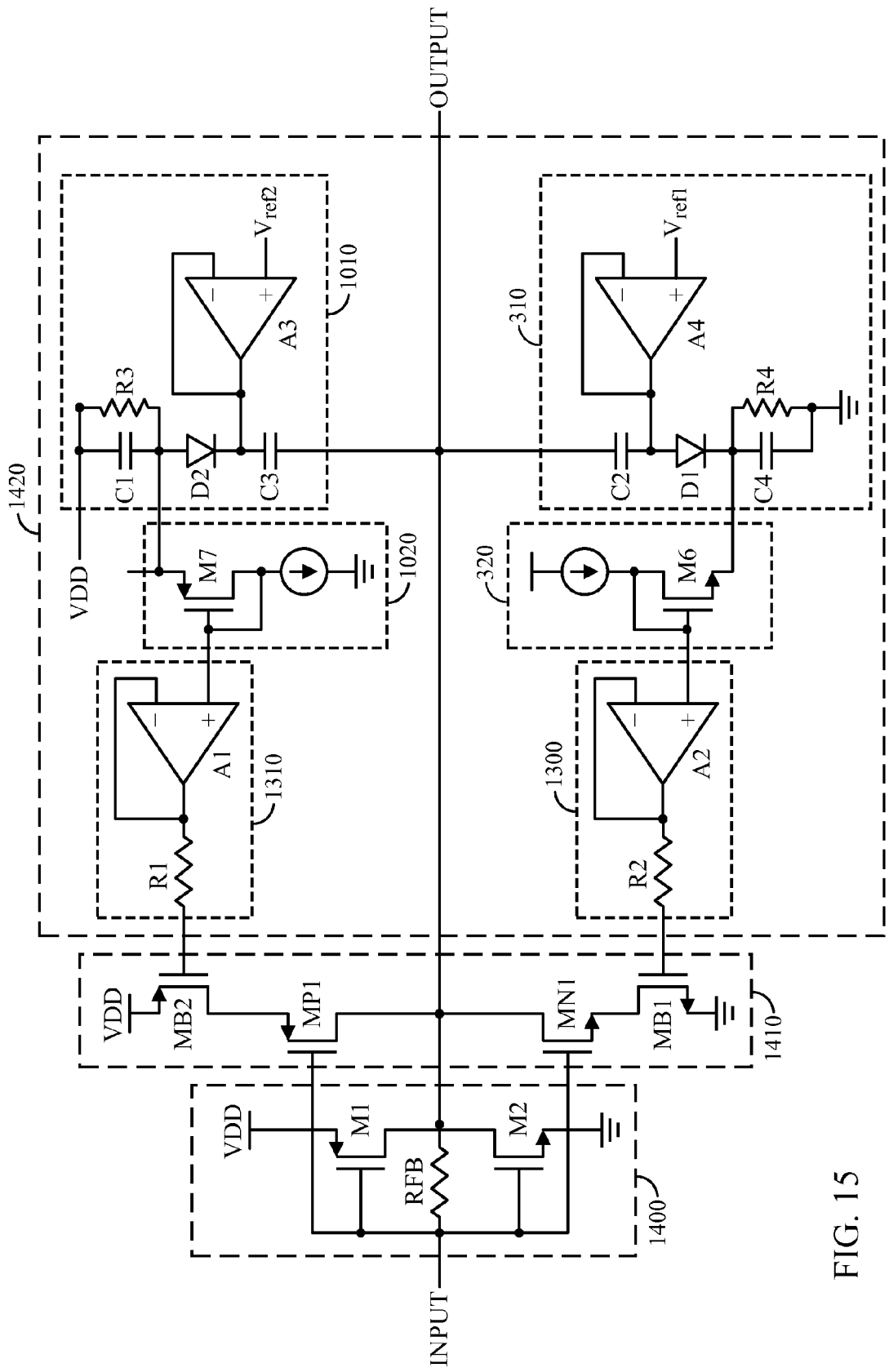
FIG. 15 depicts an embodiment of the design shown in FIG. 14.

FIG. 15 depicts an embodiment of the design shown in FIG. 14. In FIG. 15, the amplifier 1400 includes transistors M1 and M2. Variable gain amplifier 1410 includes transistors MN1, MP1, MB1, MB2, as previously described herein with reference to FIG. 1. In FIG. 15, detectors 310 and 1010 are implemented as described with reference to FIG. 8B. Bias adjusters 320 and 1020 are implemented as described with reference to FIG. 9B. Buffers 1410 and 1420 are provided as described with reference to FIG. 13.

Figure 16:
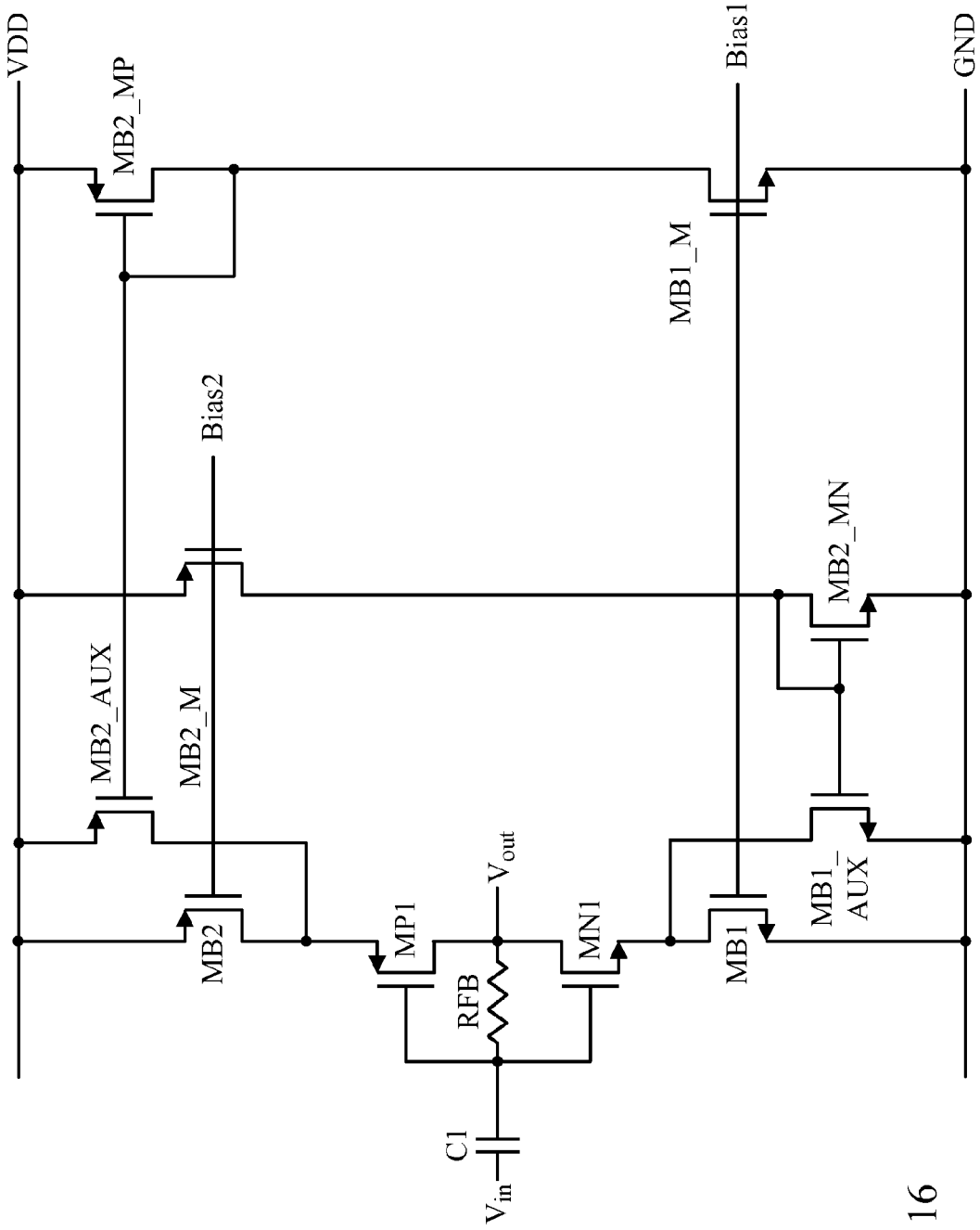
FIG. 16 depicts an embodiment of the present disclosure wherein additional bias transistors are provided to compensate for mismatch between the NMOS bias transistor MB1 and the PMOS bias transistor MB2.

A further aspect of the present disclosure provides additional bias transistors to compensate for general process skew and/or gain mismatch between NMOS and PMOS transistors in an amplifier. FIG. 16 depicts an embodiment wherein such additional bias transistors are employed to reduce gain mismatch between the NMOS bias transistor MB1 and the PMOS bias transistor MB2.

In FIG. 16, the bias voltage Bias2 is coupled to the gate of an additional PMOS transistor MB2_M. The width of MB2_M is preferably N times smaller than the width of MB2. Thus MB2_M is designed to mirror the current flowing through MB2, reduced by a factor N. A diode-connected NMOS transistor MB2_MN receives the current flowing through MB2_M, and generates an appropriate gate bias voltage for the NMOS transistor MB1_AUX. MB1_AUX is connected in parallel with the NMOS bias transistor MB1.

The width of MB1_AUX is preferably N times larger than the width of MB2_MN. In this case, MB1_AUX is designed to mirror the current flowing through MB2_MN, increased by a factor N. Based on this description, it can be seen that transistors MB2_M and MB2_MN are coupled to allow the current flowing through MB1_AUX to mirror the current flowing through MB2.

Also in FIG. 16, a corresponding set of transistors MB1_M and MB1_MP are coupled to allow the current flowing through MB2_AUX to mirror the current flowing through MB1. The width of MB1_M may be M times smaller than the width of MB1, and the width of MB2_AUX may be M times larger than the width of MB1_MP. In an embodiment, M may be equal to N. Alternatively, M need not be equal to N. M and N may be chosen such that the sizes of MB2_M, MB2_MN, MB1_MP, MB1_M are sufficiently large to allow the transistors to accurately function as current mirrors, yet sufficiently small such that the transistors do not consume too much quiescent current. One of ordinary skill in the art will realize that the techniques described with reference to FIG. 16 may, with the appropriate modifications, generally be applied to any amplifier stage that comprises an NMOS transistor coupled to a PMOS transistor. Such embodiments are contemplated to be within the scope of the present disclosure.

Figure 17:
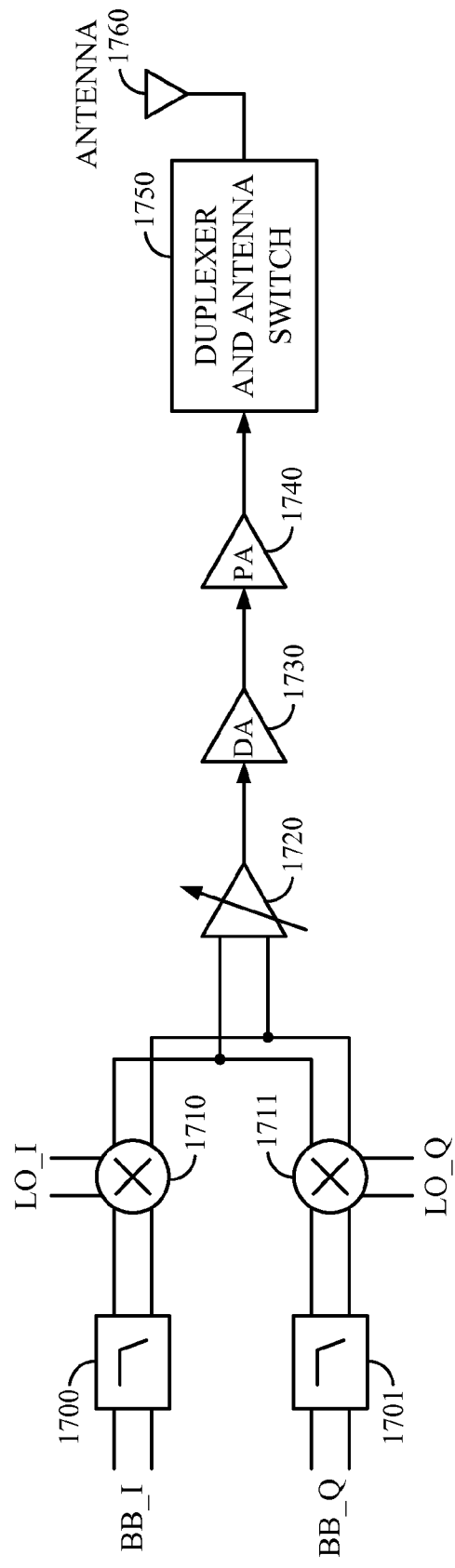
FIG. 17 illustrates an embodiment of an RF transmitter utilizing an amplifier according to the present disclosure.

FIG. 17 illustrates an embodiment of an RF transmitter utilizing an amplifier designed according to the present disclosure. In FIG. 17, quadrature mixers 1710 and 1711 accept baseband input signals BB_I (in-phase) and BB_Q (quadrature-phase) filtered by low-pass filters 1700 and 1701, respectively. The mixers 1710 and 1711 modulate the baseband signals to a higher frequency by multiplying them with local oscillator signals LO_I and LO_Q. The converted signals are input to a variable-gain amplifier (VGA) 1720. The output of the VGA 1720 may be coupled to a driver amplifier (DA) 1730, which drives a power amplifier (PA) 1740. The output of the PA 1740 is then provided to duplexer and antenna switch 1750, and coupled to an antenna 1760 for transmission over the air.

In an embodiment, the driver amplifier 1730 may be implemented as an amplifier with dynamic bias according to the present disclosure. Note that the techniques described herein may generally be applied to any amplifier design, and such embodiments are contemplated to be within the scope of the present disclosure.

Based on the teachings described herein, it should be apparent that an aspect disclosed herein may be implemented independently of any other aspects and that two or more of these aspects may be combined in various ways. Aspects of the techniques described herein may be implemented in hardware, software, firmware, or any combination thereof. If implemented in hardware, the techniques may be realized using digital hardware, analog hardware or a combination thereof. If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. An amplifier for amplifying an input signal to generate an output signal, the amplifier comprising a first bias transistor having a first bias level, the gain of the amplifier being a function of the first bias level, the amplifier further comprising:
   a first detector for measuring a first envelope of the output signal; and
   a first bias adjuster for shifting the voltage level of the output voltage of the first detector, the output of the first bias adjuster adjusting the first bias level, the first detector comprising a first diode coupled to a low-pass filter, the output voltage of the first detector being the output voltage of the first diode, the first bias adjuster comprising a source follower, the gate of the source follower coupled to the output voltage of the detector, the source of the source follower coupled to the first bias transistor to adjust the first bias level.

2. The amplifier of claim 1, the low-pass filter being an RC filter.

3. An amplifier for amplifying an input signal to generate an output signal, the amplifier comprising a first bias transistor having a first bias level, the gain of the amplifier being a function of the first bias level, the amplifier further comprising:
   a first detector for measuring a first envelope of the output signal and comprising a first diode coupled to a low-pass filter, the output voltage of the first detector being the output voltage of the first diode; and
   a first bias adjuster for shifting the voltage level of the output voltage of the first detector, the output of the first bias adjuster adjusting the first bias level, the first detector further comprising a second diode coupled in series with the first diode and the low-pass filter.

4. The amplifier of claim 1, the first diode comprising a diode-connected transistor.

5. The amplifier of claim 4, the substrate of the diode-connected transistor coupled to a bias voltage higher than the diode-connected transistor's source voltage.

6. An amplifier for amplifying an input signal to generate an output signal, the amplifier comprising a first bias transistor having a first bias level, the gain of the amplifier being a function of the first bias level, the amplifier further comprising:
   a first detector for measuring a first envelope of the output signal;

a first bias adjuster for shifting the voltage level of the output voltage of the first detector, the output of the first bias adjuster adjusting the first bias level;

a second bias transistor having a second bias level, the gain of the amplifier being a function of the second bias level, the first bias transistor being an NMOS transistor, and the second bias transistor being a PMOS transistor;

a first NMOS transistor and a first PMOS transistor, the drain of the first NMOS transistor coupled to the drain of the first PMOS transistor, the sources of the first NMOS transistor and the first PMOS transistor coupled to the first and second bias transistors, respectively, the gate of the first NMOS transistor coupled to the gate of the first PMOS transistor, the gates of the first NMOS transistor and the first PMOS transistor coupled to the input signal, and the drains of the first NMOS and PMOS transistors coupled to the output signal; and a resistor coupling the output signal to the input signal.

7. The amplifier of claim 6, further comprising:

a second detector for measuring a second envelope of the output signal; and a second bias adjuster for shifting the voltage level of the output voltage of the second detector, the output of the second bias adjuster adjusting the second bias level.

8. The amplifier of claim 7, the first detector comprising at least one diode coupled to a low-pass filter, the at least one diode of the first detector comprising a diode-coupled NMOS transistor, the second detector comprising at least one diode coupled to a lowpass filter, the at least one diode of the second detector comprising a diode-coupled PMOS transistor.

9. The amplifier of claim 8, the first bias adjuster comprising a PMOS transistor configured as a source follower, the second bias adjuster comprising an NMOS transistor configured as a source follower.

10. An amplifier for amplifying an input signal to generate an output signal, the amplifier comprising a first bias transistor having a first bias level, the gain of the amplifier being a function of the first bias level, the amplifier further comprising:

a first detector for measuring a first envelope of the output signal;

a first bias adjuster for shifting the voltage level of the output voltage of the first detector, the output of the first bias adjuster adjusting the first bias level, the first detector comprising a comparator for comparing the output signal to a reference signal, the output of the comparator coupled to a switch, the switch coupling the output signal to an envelope detector, the output of the envelope detector coupled to the first bias adjuster.

11. The amplifier of claim 1, the amplifier being a driver amplifier in a transmitter on an integrated circuit.

12. A method for amplifying an input signal to generate an output signal, the amplifying comprising coupling an input signal to an amplifier to generate an output signal, the amplifier comprising a first bias transistor having a first bias level, the gain of the amplifier being a function of the first bias level, the method comprising:

measuring a first envelope of the output signal with a first detector;

shifting the voltage level of the measured envelope of the output signal with a first bias adjuster, the measuring the first envelope comprising passing the output signal through a first diode, and low-pass filtering the output of the diode, the shifting the voltage level comprising passing the measured envelope through a source follower; and adjusting the first bias level with said shifted voltage level.

13. The method of claim 12, the low-pass filtering comprising filtering with an RC filter.

14. The method of claim 12, the measuring the first envelope further comprising passing the output signal through a second diode connected in series with the first diode.

15. The method of claim 14, the substrate of the diode-connected transistor coupled to a bias voltage higher than the diode-connected transistor's source voltage.

16. The method of claim 12, the amplifier further comprising:

a second bias transistor having a second bias level, the gain of the amplifier being a function of the second bias level, the first bias transistor being an NMOS transistor, and the second bias transistor being a PMOS transistor;

a first NMOS transistor and a first PMOS transistor, the drain of the first NMOS transistor coupled to the drain of the first PMOS transistor, the sources of the first NMOS transistor and the first PMOS transistor coupled to the first and second bias transistors, respectively, the gate of the first NMOS transistor coupled to the gate of the first PMOS transistor, the gates of the first NMOS transistor and the first PMOS transistor coupled to the input signal, and the drains of the first NMOS and PMOS transistors coupled to the output signal; and a resistor coupling the output signal to the input signal.

17. The method of claim 16, further comprising:

measuring a second envelope of the output signal with a second detector;

shifting the voltage level of the measured second envelope of the output signal with a second bias adjuster; and adjusting the second bias level with said shifted voltage level of the measured second envelope.

18. The method of claim 17, the first detector comprising at least one diode coupled to a low-pass filter, the at least one diode of the first detector comprising a diode-coupled NMOS transistor, the second detector comprising at least one diode coupled to a lowpass filter, the at least one diode of the second detector comprising a diode-coupled PMOS transistor.

19. The method of claim 18, the first bias adjuster comprising a PMOS transistor configured as a source follower, the second bias adjuster comprising an NMOS transistor configured as a source follower.

20. A method for amplifying an input signal to generate an output signal, the amplifying comprising coupling an input signal to an amplifier to generate an output signal, the amplifier comprising a first bias transistor having a first bias level, the gain of the amplifier being a function of the first bias level, the method comprising:

measuring a first envelope of the output signal with a first detector;

shifting the voltage level of the measured envelope of the output signal with a first bias adjuster; and adjusting the first bias level with said shifted voltage level, the first detector comprising a comparator for comparing the output signal to a reference signal, the output of the comparator coupled to a switch, the switch coupling the output signal to an envelope detector, the output of the envelope detector coupled to the first bias adjuster.

21. An amplifier for amplifying an input signal to generate an output signal, the amplifier comprising a first bias transistor having a first bias level, the gain of the amplifier being a function of the first bias level, the amplifier further comprising:

means for measuring a first envelope of the output signal; and means for shifting the voltage level of the output voltage of the means for measuring a first envelope, the output of said means for shifting adjusting the first bias level;

a second bias transistor having a second bias level, the gain of the amplifier further being a function of the second bias level;

means for measuring a second envelope of the output signal; and means for shifting the voltage level of the output voltage of the means for measuring a second envelope, the output of said means for shifting adjusting the second bias level.

22. The amplifier of claim 21, the means for measuring a first envelope of the output signal further comprising means for detecting if the first envelope exceeds a preset threshold value.

* * * * *